(12) United States Patent
Fenner

(10) Patent No.: US 6,805,807 B2
(45) Date of Patent: *Oct. 19, 2004

(54) ADAPTIVE GCIB FOR SMOOTHING SURFACES

(75) Inventor: David B. Fenner, Westford, MA (US)

(73) Assignee: Epion Corporation, Billerica, MA (US)

( * ) Notice: Subject to any disclaimer, the term of this patent is extended or adjusted under 35 U.S.C. 154(b) by 181 days.

This patent is subject to a terminal disclaimer.

(21) Appl. No.: 09/999,099

(22) Filed: Oct. 31, 2001

(65) Prior Publication Data

US 2002/0139772 A1 Oct. 3, 2002

Related U.S. Application Data

(62) Division of application No. 09/412,949, filed on Oct. 5, 1999
(60) Provisional application No. 60/144,524, filed on Jul. 19, 1999.

(51) Int. Cl.[7] .............................................. H01L 21/302
(52) U.S. Cl. .............................. 216/38; 216/52; 216/60; 216/66; 438/714
(58) Field of Search .............................. 216/38, 52, 63, 216/66, 59, 60; 700/28, 46, 121, 173, 175, 266; 438/714; 204/192.11, 192.34; 250/492.21

(56) References Cited

U.S. PATENT DOCUMENTS

| | | | | |
|---|---|---|---|---|
| 5,211,994 A | * | 5/1993 | Tsukazaki et al. | 427/523 |
| 5,459,326 A | * | 10/1995 | Yamada | 250/398 |
| 5,561,326 A | * | 10/1996 | Ito et al. | 257/751 |
| 6,251,835 B1 | * | 6/2001 | Chu et al. | 505/411 |

FOREIGN PATENT DOCUMENTS

| | | | | |
|---|---|---|---|---|
| JP | 62100705 A | * | 5/1987 | G02B/6/12 |

* cited by examiner

*Primary Examiner*—Allan Olsen
(74) *Attorney, Agent, or Firm*—Perkins Smith & Cohen LLP; Jerry Cohen; Jacob N. Erlich

(57) ABSTRACT

A method of processing the surface of a workpiece using an adaptive gas cluster ion beam is disclosed. The invention provides a method of reducing the surface roughness and/or improving the surface smoothing of a workpiece by etching at various etch rates. The workpiece is initially processed with a gas cluster ion beam having an initial etch rate and then the beam is adjusted so that the workpiece is processed with one or more lower etch rates. The advantages are minimum required processing time, minimum remaining roughness of the final surface, and minimum material removal in order to attain a desired level of smoothness.

29 Claims, 2 Drawing Sheets

ADAPTIVE GCIB FOR SMOOTHING SURFACES

CROSS REFERENCE TO RELATED APPLICATIONS

This application is a divisional application of U.S. Ser. No. 09/412,949 filed Oct. 5, 1999 entitled ADAPTIVE GCIB FOR SMOOTHING SURFACES which in turn claims priority of provisional application Ser. No. 60/144,524 filed Jul. 19, 1999.

STATEMENT REGARDING FEDERALLY SPONSORED RESEARCH AND DEVELOPMENT

This invention was partially made with U.S. Government support from the U.S. Department of Commerce under a NJST-ATP Cooperative Agreement No. 70NANB8H011. The U.S. Government has certain rights in the invention.

BACKGROUND OF THE INVENTION

The invention relates to the field of gas cluster ion beam (GCIB) smoothing of surfaces. Surfaces of microelectronic materials such as semiconductors, dielectrics and metals (often as thin films on a substrate) need to be smoothed after their fabrication by deposition, crystal growth, etching or similar processing. The close proximity of microelectronic components, either as multiple layers or as interacting/interconnected subcomponents requires a high figure of merit for surface quality.

Smoothing methods can be classed roughly as mechanical or chemical, and these are carried out in ambient, wet solution or in a vacuum-chamber environment. Ion beams are superior in several important respects to traditional lapping, grinding, sanding, acid/base etching, etc. In particular, the vacuum environment of the ion-beam apparatus provides contamination control for the workpiece surface that can not be attained with any wet or atmospheric-based methods. The ion beam (dry) etches, i.e., sputters, away the surface, and if the surface is initially rough the etching may reduce the roughness.

As the surface reaches a smoothness near that of the atomic dimensions of the material, the ion-beam smoothing capability reaches its intrinsic limit, i.e., its asymptotic value. That limiting amount of roughness is due to the basic or intrinsic nature of both the surface and the ion interaction with that solid surface. Unfortunately, the limiting roughness for conventional ion-beam etching methods is not sufficiently smooth to make possible many of the applications requirements that have been widely projected to be necessary for future generations of microelectronics and photonics.

It has been recognized by specialists working with ion-beam processing of surfaces that beams composed of clusters of gas atoms, roughly 100 to 10,000 atoms in each cluster, can be singly ionized, accelerated and upon impact with a surface provide superior smoothness of many materials. This is the GCIB method of etching and smoothing. The efficiency of this method is limited partly by the ion dose required to accomplish reduction of roughness to within desired limits. Ion cluster beams may be composed of various gas species, each with a range of etching and smoothing capabilities. Noble gas ion beams (such as argon) interact with a surface by physical means (called sputter etching) while other gas types (e.g., oxygen) beams will interact both physically and chemically, i.e., reactively.

The chemical ion etch is generally a faster etch, but is highly specific to the composition of the particular surface being etched. Much less composition specific, the physical ion etch will generally have the lower residual roughness for all kinds of surfaces, i.e., leave a less rough surface after an arbitrarily long exposure (high dose). Larger clusters will provide the highest final surface finish but their formation in a GCIB apparatus is less efficient such that the highest beam currents may not be attained with the largest clusters.

Beams of higher energy, occurring as a consequence of the use of a higher accelerating potential, etch faster, but are expected to have a higher residual roughness for the same cluster size or size distribution. The greater residual roughness is due to (shallow) implantation and effects referred to as ion mixing, which cause the ion beam to etch material from (shallow) subsurface regions. Higher beam currents (flux of clusters upon the surface) will also etch faster but may result in higher residual roughness than would lower beam currents as a consequence of nonlinear effects in the surface etching physics and stochastic phenomenon.

SUMMARY OF THE INVENTION

The present invention provides a method of processing the surface of a workpiece using an adaptive gas cluster ion beam. The invention reduces the surface roughness and/or improves the surface smoothing of a workpiece by etching at various etch rates. The workpiece is initially processed with a gas cluster ion beam having an initial etch rate and then the beam is adjusted so that the workpiece is processed with one or more lower etch rates. The advantages are minimum required processing time, minimum remaining roughness of the final surface, and minimum material removal in order to attain a desired level of smoothness.

DETAILED DESCRIPTION OF THE INVENTION

For smoothing a typical surface in a microelectronics application area with GCIB, the optimum final surface finish quality (smoothness) can be obtained with an argon beam at low acceleration voltage and low beam current. The time required to reach this optimal condition will be much longer than if other beam choices were made. The invention utilizes a hybrid or adaptive approach to GCIB. For example, the initial GCIB smoothing can be done by using a higher-energy beam (more acceleration) to remove (etch) as quickly as possible the initial surface with its greater roughness. During the etching, and as the roughness of the surface reaches the residual roughness limit for that beam energy, a GCIB apparatus can be adjusted so that the beam carries less energy and the etch process continues until it reaches its new and lower residual roughness limit.

Figure 1:
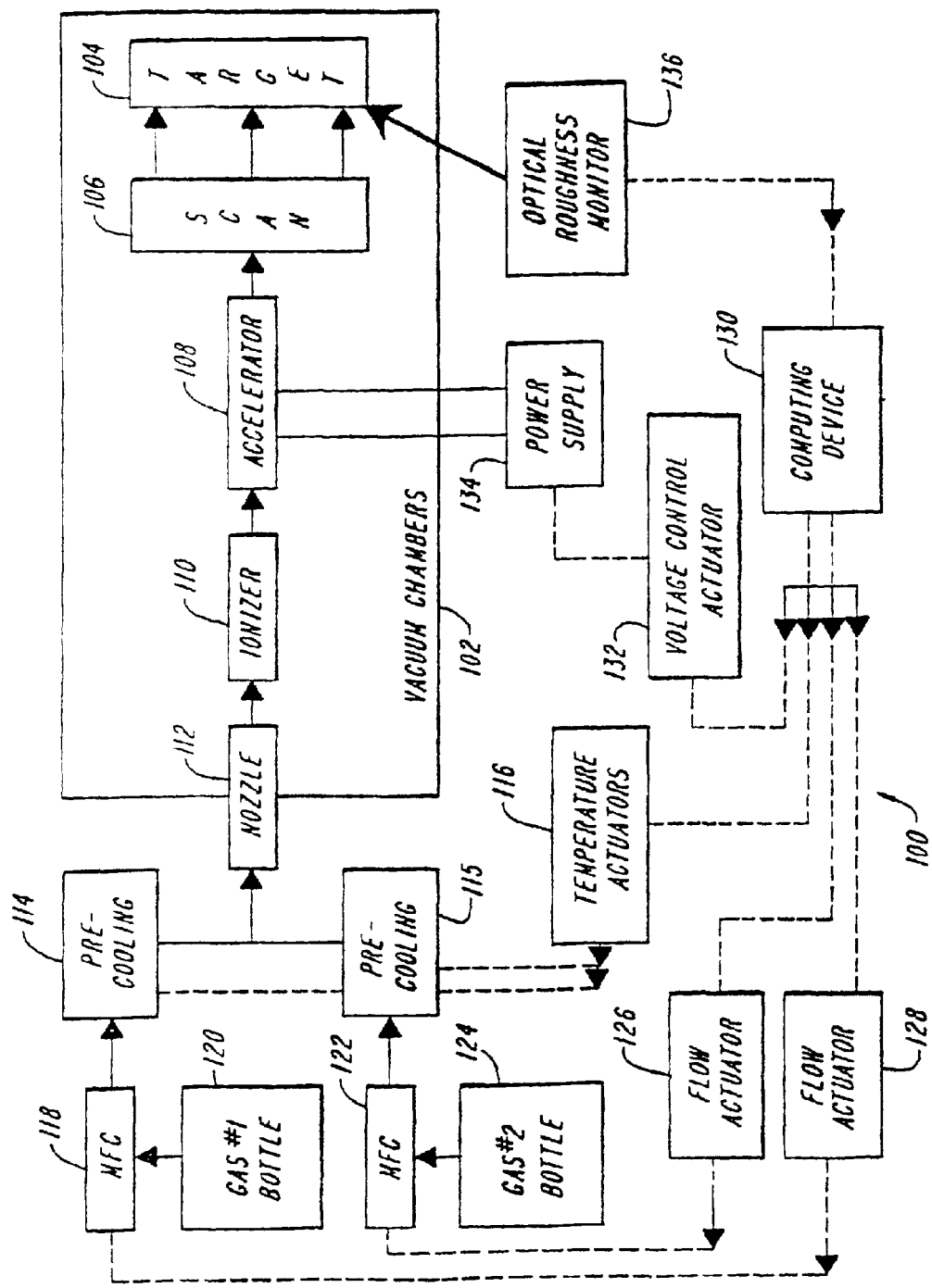
FIG. 1 is a schematic block diagram of an adaptive cluster beam smoothing apparatus in accordance with the invention.

FIG. 1 is a schematic block diagram of an adaptive cluster beam smoothing apparatus in accordance with the invention.

The gas flow path and the cluster beam are shown as solid lines and the control paths are dashed lines. The arrows indicate the direction of flow for gas, clusters or information, respectively. The vacuum system is multiply chambered with individual pumps (not shown) for each. The optical path for the inspection of surface roughness is shown as a heavy line and arrow.

Apparatus 100 of FIG. 1 includes vacuum assembly 102 for generating the gas-cluster ion beam. A first gas, e.g., argon, is stored at high pressure in a gas bottle 120. The gas passes out through a mass-flow controller (MFC) 118 which consists of a diaphragm regulator and flow-measuring sensor as well as means to feedback the flow information to the regulator, that being typically electronic in nature and adjustable by the system operator or computer acting on an instructional scheme. The gas then flows into a pre-cooling apparatus 114, that consists of a heat exchanger which is in turn cooled by a cryogenic means, such as circulating liquid nitrogen or the cold end of a closed-cycle (recirculated) refrigeration system. At least one additional gas may be mixed with the gas originating from the bottle 120. A second gas from a gas bottle 124 would pass through MFC 122, and pre-cooling apparatus 115 before mixing with the gas originating from bottle 120. The gas or gasses flow in a small-diameter tube, at a pressure of typically ten atmospheres, to a nozzle 112.

The nozzle 112 typically has a bore of 50 to 100 $\mu$m diameter and an exit cone with a small-solid angle of about 10°. Preferably, the shape of the exit cone on the nozzle is that of the Laval nozzle. The gas forms a supersonic jet and is adiabatically cooled by its expansion through the nozzle into the first vacuum chamber of the assembly 102. If the gas density falls slowly enough during its passage through the exit cone there is sufficient time for the cooled, supersaturated vapor to condense into droplet nuclei and grow, by aggregation, into small drops, i.e., large clusters of a few thousand gas atoms or molecules. This jet of clusters and residual gas is directed at a small opening in the first vacuum chamber wall and the core of the jet, which has the highest concentration of clusters, passes into the second vacuum chamber. The first chamber is maintained at a pressure of about 10 to 100 mTorr by a vacuum pump and the second chamber at a pressure of $10^{-5}$ Torr or less, by a second pump.

After entering the second chamber, the jet of clusters passes into the ionizer apparatus 110 and here into the core of a wire-mesh cage that is the anode of a low-energy electron beam, typically 100V. These electrons impact on the clusters and cause knock-off of electrons from the cluster, which in turn serve to ionize the clusters, typically with just one net positive unit of charge. The ionized clusters are extracted from the ionizer 110 by the first electrode element of the accelerator 108.

As a second component of the accelerator, there is an electrode with a large negative potential or voltage relative to that of the extractor electrode, that voltage difference being the acceleration potential. As a third component of the accelerator 108, there is a set of typically three electrodes that function as a converging lens and, upon appropriate choice of voltages for those electrodes, this lens serves to focus the cluster ion beam at a predetermined point downstream in the beam path. At that focus point on the beam axis the workpiece target 104 is located, it being perpendicular to the beam. Near but parallel to the ion beam path, and between the last electrode of the accelerator 108 and the target 104, are located fixed pairs of plates 106 that serve to electrostatically scan the beam by virtue of voltage differences between the plates. One pair of the plates when biased causes deflection of the beam within the horizontal plane while the second pair deflects in the vertical plane.

Electrical power supplies 134, external to the vacuum assembly 102, provide bias voltages and current to the various electrodes of the ionizer 110, accelerator 108, and scanner 106, within the vacuum chamber. Typically, a set of individual power supplies will be used, one for each electrode, and each independently controlled external to the assembly 134 by a voltage-control actuator 132. Simpler configurations can also be used, such as a single power supply with a resistor ladder network to divide out the required voltages. However, in the present invention, at least one of the electrode voltages preferably will be individually adjustable according to the adaptive method. Various intermediate schemes with multiple power supplies may be utilized and provide some electrical advantage. All the electrodes may be driven by a set of supplies connected in parallel or series, or even combinations of these, as well as together with at least two electrodes driven from a resistor divider as well. Some of the supplies will internally regulate themselves by electronic means, to a set voltage or current, that set value being provided by the actuator 132, and preferably communicated by fiber-optic relay and electrical means. The optical-link relay is preferred since for some connection configurations, some of the power supplies 134 are operated at very high voltage above the ground or system-common potential.

Inspection and monitoring of the target 104 workpiece surface is preferred so as to provide a quick indication during the surface processing as to the extent to which the GCIB has accomplished its task, as expected within an allotted time. Means are provided in the invention by way of an optical roughness monitor 136 wherein an optical method of measurement is utilized, since it can do so while working well away from the normal incidence angle that the cluster beam requires and can do so without contact or disturbance to that workpiece surface. The strength of a laser light beam scattered, i.e., nonspecular reflection, from the target surface after glancing incidence is a useful indicator of surface roughness. Very fine-scale roughness will require short wavelength light, e.g., ultraviolet, for practical sensitivity. Access into the vacuum assembly 102 is provided by windows composed of material that is transparent at the wavelength utilized. The intensity of the scattered light, or other optical parameter, is measured by an optical detector within the monitor 136 and an electrical output provided to a central computing device 130.

Utilizing the signaled information from the monitor 136, the computing device 130 makes certain logical determinations. Those logical determinations are encoded into digital or analog signals and delivered to various actuators via signaling connections (shown as dotted lines from the computing device 130 to temperature actuators 116, flow actuators 126,128, and voltage control actuator 132, thereby forming a control loop for the GCIB apparatus. The flow actuators 126 and 128 provide means to convert the signals from the computing device into mechanical or similar actuation that adjusts the set point for the mass-flow controllers 118 and 122, respectively. The temperature actuators 116 provide means to convert the signals from the computing device into actions that adjust the set point of the gas pre-cooling apparatus 114 and 115. In addition, the voltage-control actuator 132 provides means to electronically adjust the set point of operation for all the power supplies in the assembly 134.

The computing device 130 may utilize any of various schemes to arrive at the logical determinations that adapt the GCIB apparatus during its processing of each workpiece. The simplest is just a time chart that instructs voltage changes after specific time intervals following the start of the processing. The preferred algorithm would be a combined mathematical calculation from a detailed theoretical model (or approximation, etc.) of the curve shapes in FIG. 3 together with in-process information provided by the optical monitor 136. The mathematical calculation utilizes many curves of the shape 300 and 302 illustrated in FIG. 3 that show reduction in the roughness following an exponential decay to an asymptote.

Generally, only the three parameters of (1) the initial roughness, (2) the decay rate, and (3) the asymptote value, are required to characterize each curve such as 300. By calibration of the apparatus under fixed operating conditions, the detailed knowledge can be found as to how etch rate and asymptote depend on the GCIB parameters such as acceleration voltage, cluster size, gas type and pre-cooling. With that information, which must be measured for each composition and type of workpiece, there will be a unique sequence of changes or adaptations in the GCIB apparatus that will provide the most rapid process to reach the best final asymptote with minimum surface roughness. In an exemplary embodiment, the computing device 130 will start with tabulated parameters of etch rate and asymptote predetermined for each workpiece material, find by calculation the fastest set of adaptations or sequence of GCIB-processing parameters, and then execute this sequence while utilizing process-monitor information to make minor adjustments for each individual workpiece.

More complex adjustment schemes for the beam energy will be preferred as they will even more quickly facilitate arriving at the desired surface quality. The beam energy in the invention is constantly under adjustment so that it is always proceeding toward the final finish desired (both etch depth and surface roughness) at the fastest rate possible for that stage of the etching.

Each composition of surface (material) will have at least a somewhat different interaction with each beam, and thus the optimal adjustment of the apparatus at each instant of the process will depend on the type of material being smoothed. For example, soft gold films will have a somewhat different physical ion-etch behavior under GCIB, due to the differing sputter mechanics at the atomic level, than will brittle and hard ceramics such as alumina. The invention provides a method that is capable of optimizing the GCIB to each surface composition and to each initial surface roughness.

A further feature of the GCIB effect on surfaces is the removal of surface contamination. At acceleration voltages below the threshold value for the surface under process, the cluster ions impacting the surface do not appreciably etch the surface, but contaminants on the surface can be dislodged and thereby removed from the surface. Due to the generally weaker bonding energy (adhesive forces) of foreign contaminants compared with the stronger solid substrate material bonds (cohesive forces), it will be possible to select ion energies that are capable of breaking the former (ion energy greater than the adhesion) with little or no damage to the substrate (ion energy less than the cohesion). The invention provides a GCIB apparatus that can be adapted to operating conditions such that surface cleaning (decontamination) occur, and then adapted to etching and smoothing operating conditions. It is preferable that these are all utilized for each workpiece so that the final surface has been cleaned, etched down to the desired depth and left with a final surface roughness as low as possible.

The conventional GCIB smoothing process of ion etching can be improved by the adaptive technique of the invention.

With a cluster-ion beam, the etch rate and steady-state level of residual roughness of the target object are largely independent parameters that are influenced by many factors. Practical use of GCIB smoothing will be greatly enhanced if the parametric effect of these factors is understood and manipulated by the processing method and configuration of the apparatus. For example, the time required to reach the optimal smoothness condition (minimal residual roughness) will be much shorter if the beam is adapted during the process, much as one might change from coarse to fine grit size when using sandpaper to smooth the surface of wood as the surface becomes progressively smoother. As an alternate practical goal, it may be desired in the process to ion-beam etch through a certain given thickness of material at the maximum rate possible, such as in thinning a deposited layer so as to attain a desired final film thickness. After completing the desired etch depth, it will be of additional value to render that same and final surface as smooth as possible.

Figure 2:
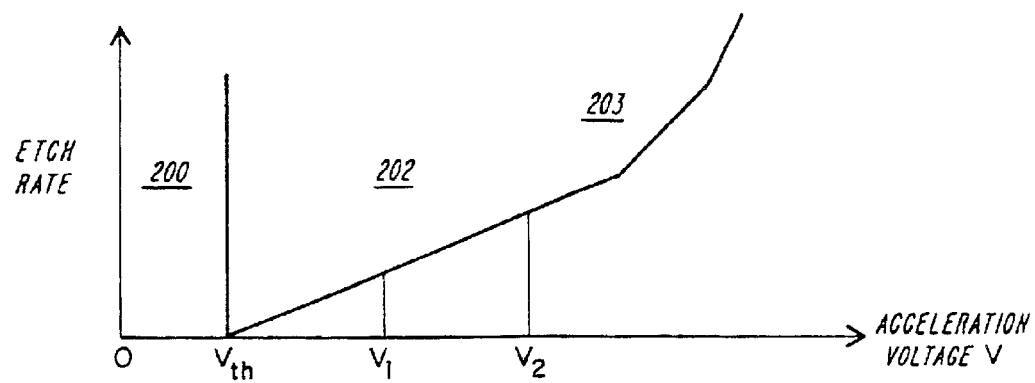
FIG. 2 is a conventional graph showing schematic etch rate (solid line) of cluster ion beam for various acceleration voltages, sequenced as $V_{th} < V_1 < V_2$.

Each type (chemical composition and structure) of surface material (film, or bulk if it is exposed) will have an etching-onset threshold, an etch rate and steady-state residual roughness that is in general unique from other material types. FIG. 2 is a conventional graph showing schematic etch rate (solid line) of cluster ion beam for various acceleration voltages, sequenced as $V_{th} < V_1 < V_2$. The acceleration voltage scale is divided into regions where different effects predominate. In region 200, the surface is cleaned by a low energy beam. In region 202, not too far above $V_{th}$, a linear etch rate occurs. In region 203, which extends off-scale to high energy (voltage), enhanced etching will occur but the surfaces will not be smoothed.

These etch characteristics are a consequence of the microscopic details of the interaction of the ion beam and the unique material properties of the target material, whether the ions are single atoms, or molecules, or clusters of these. In addition to the kinetic energy of the ion beam, the size of the clusters (number of constituent atoms or molecules) and the state of condensed matter that the cluster is in at the time that it impacts the target surface, will effect the nature of the beam interaction with the surface. Conservation of momentum of the incident clusters is attained in several ways depending on features of the clusters and the surface, such as the size and energy of the cluster, the peak pressure and temperature caused by the collision, the stress-strain response of the cluster and surface including the extent of plastic deformation, the intensity of the acoustic shock wave generated within the cluster relative to the cluster fracture strength, and the extent to which the cluster and surface respond in an elastic manner, i.e., conserve the incident cluster energy.

Sputtering of pure elemental metals by monomer ions typically is found to etch only for ions above a threshold ion energy that is approximately proportional to the heat of sublimation for those metals. It is conventionally reported that the etching rate of metals by argon clusters increases approximately linearly with acceleration voltage above a threshold, that being about 5 to 7 kV for typical situations. FIG. 2 illustrates this threshold as well as a linearly increasing etch rate above the threshold. Also, it has been reported that gold films are etched to lower and lower amounts of roughness (measured as either average roughness $R_a$ or root-mean-square roughness $R_{rms}$) as additional dose accumulates from an argon cluster beam. This situation is illustrated in FIG. 3, where the $R_a$ or $R_{rms}$ approach exponentially toward the minimum value attainable.

Figure 3:
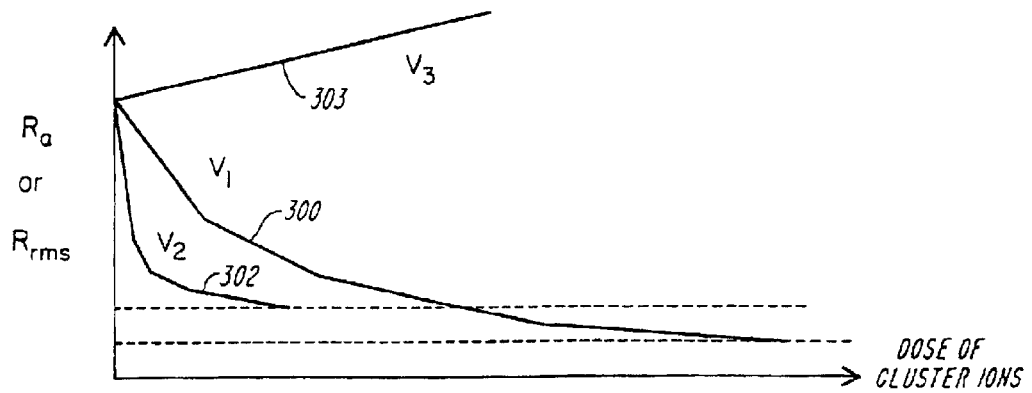
FIG. 3 is a conventional graph showing progressive reduction of roughness with cluster dose at constant acceleration voltage for the cluster ion beam.

FIG. 3 is a conventional graph showing progressive reduction of roughness with cluster dose at constant acceleration voltage for the cluster ion beam. Three etch curves are shown, one 300 done at voltage $V_1$ and the other 302 at $V_2$, with $V_1<V_2$. The curve 303 for $V_3$, with $V_3>>V_2$ is etching at such a high voltage that the surface is made rougher. The curves are drawn in segments for illustrative purposes, but in reality would be smoothly curving. The curve 302 at $V_2$ is the most steeply declining but has an asymptote at a higher $R_a$, than does the curve at $V_1$, while the latter is slower to decline, but has the lowest $R_a$ for high dose.

A mathematical model is reported together with computer simulations of cluster etching using that model. A simulated etching was found to depend on acceleration voltage or energy, with increasing etch rate at increasing energy, but with asymptotic roughness (at very high dose) that decreased with increasing energy. The invention provides that this can not be the outcome under realistic ion-etching conditions. The residual roughness that remains after an ion etch for a very long time, hence a high dose, will certainly depend on the extent to which cluster impacts with the surface of the workpiece penetrate the surface and sputter off material that originates from below the immediate surface region. This is illustrated schematically in FIG. 3, where the asymptotic (high dose) roughness ($R_a$ and $R_{rms}$) of the lower voltage ($V_1$, with $V_1<V_2$) is itself smaller.

Conventional measurements of atom, molecule and cluster ion impact and etching show a trend toward decreasing depth penetration and disruption as the ion energy is reduced, until that energy reaches the minimum or threshold required for an etching to occur. Measured depth profiles of the concentration of the incident ion species below the surface of the workpiece indicate this trend quite clearly. The invention provides that with cluster etching the asymptotic roughness at high dose will be at a minimum for etching with cluster ion beams accelerated to energies just above the threshold for etching. The threshold energy can be assessed experimentally for each type of workpiece material and for each composition, thermodynamic state and acceleration of the cluster beam.

Figure 4:
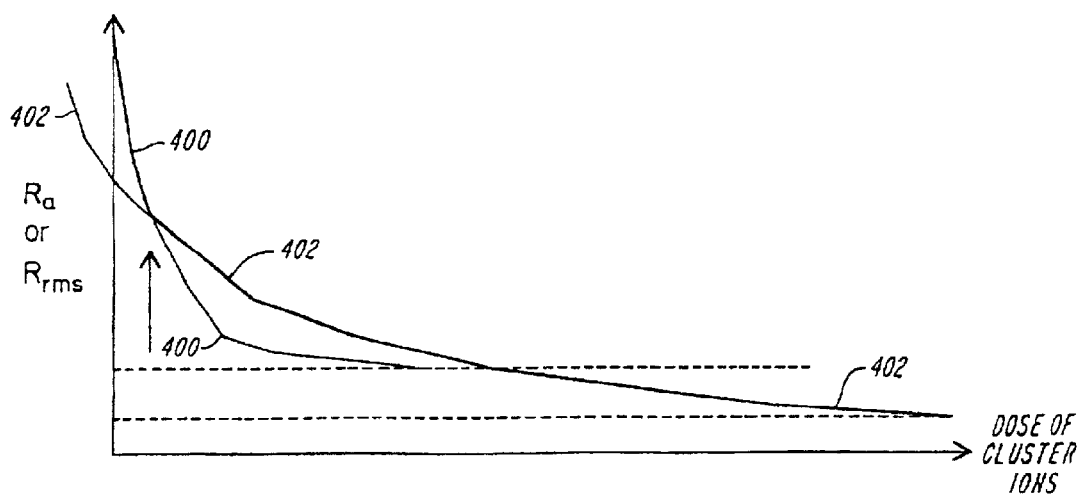
FIG. 4 is a graph showing progressive reduction of roughness with cluster dose by an adaptive GCIB method in accordance with the invention.

An adaptive GCIB etching process in accordance with the invention is illustrated in FIG. 4. FIG. 4 is a graph showing progressive reduction of roughness with cluster dose by an adaptive GCIB method in accordance with the invention. Etching begins at curve 400 with clusters constantly at $V_2$, then abruptly changes to curve 402, at a dose where the vertical arrow is located. Both curves 400 and 402 are extended before and after the crossover point by curved dotted lines. Etching continues along curve 402 at constant voltage $V_1$, with $V_1<V_2$. The combined etch curve (solid lines only) is the adaptive method. Asymptotes for etching at $V_1$ and $V_2$ are shown as horizontal dashed lines.

The etch begins with a larger acceleration voltage $V_2$, approximately 20 kV to 60 kV, causing a relatively rapid etch rate, and a dose to the workpiece is accumulated until the $R_a$ or $R_{rms}$ is reduced by some significant amount. The acceleration voltage is then reduced to $V_1$, approximately 5 kV to 7 kV, (shown as a kink or abrupt bend in the etching curve) and the exposure continues until a large enough dose accumulates such that the exponential curve is well toward its asymptotic value. The single etch curve can be seen as essentially a piecewise combination of the two curves. It is important to notice that this two-step adaptive process provides rapid reduction of roughness early on when the workpiece surface is at its roughest, but then adapts to a lower voltage since the higher value will not provide the desired small asymptotic roughness. As an adaptive method, multiple steps in the voltage would be even more efficient of the exposure time as would continuously changing acceleration voltages.

As an example of adaptive GCIB, a sequence of system operational conditions is described based on known etching parameters, as well as desired final etch depth and maximum surface roughness. Toyoda et al. report in proceedings of the conference "Applications of Accelerators in Research and Industry", edited by Duggan and Morgan (Amer. Inst. Physics Press, New York, 1997), on page 483, that argon cluster-ion beam etching of copper films on silicon wafers has an approximate threshold voltage $V_{th}$=6,000 V, and a sputtering yield Y that is linearly proportional to the cluster acceleration voltage V above $V_{th}$, according to $Y=(4.2\times10^{-3})$ $(V-V_{th})$ in units of sputtered atoms per incident ion.

From the yield Y the etch depth d, can be calculated by using the following expression:

$d=(DY)/\rho_a$ in units of cm, and where D is the cluster-ion dose density, D=Jt/e, for J the ion-beam current density (A/cm$^2$), t the exposure time, e the elemental charge e=1.6× $10^{-19}$ coulombs, and $\rho_a$ the atomic density of the solid (atoms/cm$^3$). Hence:

$$d=(4.2\times10^5)(V-V_{th})D/\rho_a, \text{ in units of Å.}$$

For example, the density of atoms in solid copper is $\rho_a$=8.5×10$^{22}$ atoms/cm$^3$. If the ion beam in this example has J=10$\mu$A/cm$^2$ and V=27 kV, then with t=1 sec of exposure, the etch depth is expected to be about d=6.5 Å, or in about t=1 hour of exposure d=2.3 $\mu$m.

The etch depth d calculated here is the depth between two ideally flat surfaces or the average depth between two rough surfaces. Clearly a measured d is more statistically meaningful if the average roughness $R_a$ of the higher and the lower surfaces are both much smaller than d, i.e., $R_a<<d$. It is a general feature of the GCIB process that the cluster ions reduce the surface roughness ($R_a$) upon impact at normal incidence. Yamada et al. have reported on the roughness reduction process in The Journal of Vacuum Science and Technology, Volume A14, page 781, 1996. There the reduction in $R_a$ is reported to occur in an exponential fashion with dose density D, nominally as:

$$R_a=(R_1-R_0)\exp(-D/\Delta)+R_0$$

where $R_i$ is the initial roughness of the surface, $R_0$ is the asymptotic or limiting roughness attained after arbitrarily long exposures, and $\Delta$ is the exponential dose characteristic for roughness reduction. (This exponential function is that illustrated in FIG. 3, as curves 300 and 302.) For thin films of copper that had been fabricated on silicon wafers, an argon cluster-ion beam with 20 kV of acceleration was reported to smooth a film with initial $R_i$=58 Å toward an estimated $R_0$=12 Å, requiring a dose of about 1×10$^{15}$ ions/cm$^2$ to reach 1/e (=37%) of the quantity ($R_i-R_0$). Hence $\Delta$=1×10$^{15}$ ions/cm$^2$ for this situation.

Further, it is estimated here that $R_0=\alpha(V-V_{th})$ with approximately $\alpha$=1×10$^{-3}$ Å/V, and $\Delta=\beta/(V-V_{th})$ with approximately $\beta$=1.4×10$^{19}$ ions/cm$^2$. Both of these linear relations assume that the acceleration V is larger than, but not too much larger than $V_{th}$, i.e., V must be greater than $V_{th}$ and less than about 100 kV. It can also be seen that as V approaches $V_{th}$ then the residual roughness ($R_0$) and both the rates of smoothing (1/$\Delta$) and of etching (d/t) all tend toward zero, which is a primary motivation for the adaptive-GCIB invention. This example is further developed by extension to mixed gasses for forming the cluster beam, and in particular the example that the pure argon gas is replaced by a mixture of argon and oxygen gasses at a volume ratio of 80:20. For this it is estimated that the etching of the copper film will be accelerated about threefold, hence $Y_m=3Y$ and $\Delta_m=\Delta/3$, but that the asymptotic roughness (that after very long exposures) will increase twofold, hence $R_{0m}=2R_0$, where each of Y, $\Delta$ and $R_0$ are the values for pure argon gas, calculated as above.

A possible scenario for an adaptive-GCIB process to smooth and etch a thin-film surface is illustrated by the following sequence of apparatus operational parameters. The particular workpiece in this example is composed of a copper film that has an initial surface roughness of $R_i=100$ Å, and responds to the GCIB according to the various parameters and their numerical values shown in Table 1, below. The film is processed with four sequential GCIB exposures, each one of which reduces the film roughness and etches away a certain thickness of the film. The four sets of operational conditions and the film roughness and etch depth are tabulated in Table 2, below.

Briefly, step one comprises an aggressive etch with a gas mixture and high acceleration voltage, followed by a re-measurement of the surface roughness in-situ (using laser-light scattering). Step two comprises pure argon etching at that high voltage, step three reduces the voltage somewhat, and finally step four completes the process sequence with pure argon and an acceleration voltage only somewhat above that of the threshold energy.

The in-situ measured $R_a$ in each case are accomplished after the GCIB exposure in each step, and then used as the basis for calculating the expected effect of the next exposure step. In this example, the apparatus is operated at a constant cluster-ion beam current (J) for all of the steps illustrated. Thus, the exposure time (t) can be calculated from the dose (D) indicated for each step.

TABLE 1

Parameters for example of adaptive-GCIB process.

| Parameter | Symbol | Numerical Value |
| --- | --- | --- |
| Film density | $\rho_a$ | $8.5 \times 10^{22}$ atoms/cm$^3$ |
| Initial roughness | $R_1$ | 100 Å |
| Threshold energy | $V_{th}$ | 6,000 V |

TABLE 2

Operational conditions and stepwise changes in the film during adaptive process.

| Operation | Initial | Step # 1 | Step # 2 | Step # 3 | Step # 4 |
| --- | --- | --- | --- | --- | --- |
| Gas to form cluster-ion beam | — | Ar + O$_2$ | Ar | Ar | Ar |
| Acceleration Voltage V | — | 30 kV | 30 kV | 20 kV | 10 kV |
| Sputter Yield Y | — | 300 | 100 | 60 | 17 |
| Dose Characteristic $\Delta$ (ions/cm$^2$) | — | $2 \times 10^{14}$ | $6 \times 10^{14}$ | $1 \times 10^{15}$ | $3.5 \times 10^{15}$ |
| Dose D, this step (ions/cm$^2$) | — | $1 \times 10^{14}$ | $5 \times 10^{14}$ | $1 \times 10^{15}$ | $5 \times 10^{15}$ |
| Asymptotic $R_a$ (Å) | — | 50 | 25 | 15 | 5 |
| Calculated Process $R_a$ (Å) | — | 80 | 47 | 27 | 10 |
| In-Situ Measured $R_a$ (Å) | 100 | 75 | — | — | 11 |
| Etch Depth d, this step (Å) | 0 | 36 | 59 | 69 | 100 |
| Etch Depth, cumulative (Å) | 0 | 36 | 95 | 164 | 264 |

By way of illustrating the advantage of the adaptive process, it is noted that of the four steps, only step four has the ability to reach the final roughness $R_a$, that the sequence shown in Table 2 did. If only a single process is used for comparison and, except for dose, the operational conditions were those listed for step four, a larger dose of $9.7 \times 10^{15}$ ions/cm$^2$ would be required. This single-process dose is 1.5 times larger than the four-step process illustrated in Table 2. If the GCIB apparatus operates at a cluster-ion beam current of J=10 μA/cm$^2$ for all of the processes in this example, then the adaptive process would require a total exposure time of 106 sec and that of the single process 155 sec. Hence, the advantage of the adaptive process of the invention.

As an example of the significance of the etching threshold, consider that at low incident energy of a cluster beam onto a surface under highly elastic conditions, there may be only weakly irreversible effects and the clusters will bounce elastically without fracturing (etching) any of the surface material or even themselves. As another example, clusters of larger size can be formed from a given gas, e.g., argon, by pre-cooling that gas, e.g., using cryogenic methods, or by mixing in a high concentration of a lighter gas, e.g., hydrogen or helium, which subsequently is pumped away in the vacuum chambers well before cluster impact. At the same ion-cluster acceleration voltage, all singly charged clusters generated will have the same kinetic energy. But the larger clusters in this example will have a lower momentum and velocity and less average kinetic energy per constituent atom. The combination of these parameters will effect the nature of the collision impact with the target surface and hence the etching.

At relatively high cluster-impact rates (number of cluster collisions per second), and hence etching rates, the impact, sputter and etching processes may well become nonlinear or more nonlinear than at lower rates. As a consequence, etching at high beam currents (number of ions per second, with each ion being essentially one cluster) may increase nonlinearly. According to the invention, the high etch rate may be useful in the initial stages of an etch to smooth the surface of a workpiece, but the final residual roughness of the surface will be positively affected if the beam current is reduced toward the end of the etch process to the point that the etch mechanisms are more nearly linear.

Clusters, as small pieces of matter in a condensed physical state, have a thermodynamic state, may be liquid or various solid forms, and have a temperature. During transit through the vacuum chamber from formation in the nozzle apparatus until impact with the target surface, the clusters will evaporate some of their material as they tend toward thermodynamic equilibrium with the ambient vacuum. This evaporation will result in evaporative cooling and a reduction of the cluster temperature.

For argon, as an example, the solidification temperature is only a little lower than the liquid condensation temperature, and thus it is expected that under most conditions an argon cluster impacts a target surface in the solid state. The viscous-flow and elastic nature, including the fracture strength, of solids depends on many parameters including the bond strength, the presence of crystalline material and nature of crystal defects or polycrystallinity, as well as the temperature. Liquid and solid argon are bonded by van der Waals forces, which are characterized by very weak attractive forces and very strong (hard core) repulsive forces.

For acceleration not too far above the threshold, the etching effects of the impact of a very cold gas-cluster beam will be greater than that of a nearly melted (and hence soft) solid cluster or that of clusters in the liquid state. This is evidenced by the considerably increased abrasive and eroding effects of a jet of ice crystals onto a surface compared with that of a water jet. Ice, however, is bonded much stronger than is solid argon. Generally, the GCIB smoothing process will be enhanced by apparatus able to create clusters in different states and temperatures as well as processing methods that utilize these features to improve the practical application of this smoothing.

Vacuum-based, dry etching with ion beams is especially well suited to microelectronic-circuit manufacturing by batch processes on large diameter wafers, e.g., silicon. Here it is often the situation that the surface which must be etched (or film that must be thinned) must also be rendered smooth, i.e., of lower roughness. The use of GCIB is particularly advantageous for such applications, since it represents a substantial advance in the art over conventional ion etching methods. As with all methods of ion etching, each composition of matter in the surface of the workpiece may exhibit an etch rate distinct from that of other compositions.

For example, the surface may include lithographically patterned metal films that are intended as circuit wiring in VLSI or as ferromagnetic sensors in hard-disk memory heads, and these are separated, according to the pattern, by dielectric film materials such as a silicon-oxide or aluminum-oxide compounds. It is often desired then to thin these two-component surfaces, i.e., metal and oxide films, in such a manner as to not cause any height or thickness differences between the two components. Or, if height differences already exist, to reduce or eliminate these, i.e., to planarize the surface. Control of differential etch rates can provide an improved result for planarization etching, but adaptation of the etch apparatus to each material and stage of the process will be required for this advantage to be realized.

The etch rates of any two materials will in general depend on both their physical and chemical etching or sputtering rates, which in turn depend on the composition and energetics of the ions used in the process. For example, argon as an inert gas only etches by physical sputtering means, while oxygen ions incident onto an oxidizable metal surface can etch both physically and chemically depending on the ion energy and other parameters. At high energy, all ions tend to etch predominately by physical sputtering, but just above the threshold energy chemical effects usually dominate. The various methods of dry chemical etching of surfaces by ions are often referred to as reactive-ion etching (RIE). Halogens and gas-phase compounds containing halogens are also well known in the art of ion etching to have selectively higher etch rates on the surfaces of certain materials.

Gas cluster ion beams have the property of etching by physical and chemical means much as do conventional monomer ion beams. The invention provides a method to improve the planarity of two-component surfaces as an additional and intended consequence of the GCIB smoothing process. The clusters themselves can be formed in a mixed-gas solvated composition of, for example, argon with a few percent of oxygen or chlorine. If the source gas supplied to the nozzle consists of both argon and oxygen with the latter at a high percentage, that being greater than about 20%, the two gasses will generally each form clusters but with primarily only one or the other gas type in those clusters.

GCIB with either the solvated-mixture clusters or the mixture of distinct clusters can be utilized for etching two-component surfaces, and, under suitable conditions render those surfaces planar and extremely smooth. In addition, the GCIB with pure argon can be chemically assisted by injecting a small stream of the chemically reactive gas, such as oxygen or chlorine, at or near the workpiece surface. This is an improvement on earlier methods of chemically-assisted ion-beam etching (CAIBE) known and utilized, for example, to etch crystal-facet mirrors on compound-semiconductor laser diodes.

The optimal process and adjustment of the apparatus will generally be possible by changing the beam parameters of the apparatus as the smoothing process is underway, and will further be possible by an immediate knowledge of the remaining roughness and etch depth of the target surface. Thus, it is most desired for the invention to utilize instrumentation that is able to provide direct and immediate information about the roughness and depth of the target workpiece during the ion-beam processing, i.e., in-situ process monitoring.

Furthermore, apparatus capable of modification of the ion-beam characteristics during the process will be essential to adapt the process during the period of execution of that smoothing process. In addition, an automated computing mechanism that can apply decision algorithms based on information provided by the in-situ process monitor and provide subsequent instructions to electromechanical actuators on the ion-beam-forming apparatus will make possible a closed-loop process control and a preferred adaptive smoothing of the workpiece. These features are illustrated with respect to the apparatus 100 of FIG. 1.

A great number of methods and variety of instruments are available for surface metrology. Many of these have been demonstrated as suitable for in-situ process monitoring of a workpiece within a vacuum chamber. Optical techniques are particularly well suited for this application. The wavelengths must be chosen so as to efficiently propagate through the gasses within the vacuum chamber and to be maximally sensitive to the surface characteristics that are to be monitored in each process. For example, grazing incidence of a laser beam will reflect off of a surface and generate a speckle pattern, i.e., small-angle scattering, that is sensitive to roughness of the surface at length scales from a few wavelengths down to a small fraction of the wavelength. If the incident optical beam is polarized and the polarization of the reflected beam is analyzed then the surface roughness is expressed by the ellipsometric parameters $\Psi$ and $\Delta$. Electron beam instruments are also well suited and reflection high-energy electron diffraction (RHEED) has seen wide use for characterization of surface crystallinity and, to a lesser extent, roughness. X-ray beams can also be utilized.

The cluster-beam accelerator functions by way of a high electric potential difference (voltage) between electrodes in the vacuum chamber. The potential is driven by a power supply external to the vacuum chamber. Electronic power supplies are preferred, and further, those that provide a means for controlling the strength of the acceleration potential (voltage) by way of a low-level relay potential are preferred. The relay potential is supplied remotely and adjusted by the operator of the GCIB apparatus or preferably by direct analog output of a digital-computing device. The cluster size can likewise be controlled and adjusted by the operator or computer via electromechanical gas-flow valves, gas-pressure regulators and cryogenic cooling apparatus including heat exchangers. The first two means are used for adjusting the main gas source for forming clusters, e.g., argon, and for mixing a second or lighter gas and subsequent enhancement of the clustering action within the nozzle.

The cryogenic cooling means typically utilizes the flow control of a cryogenic fluid such as liquid nitrogen (sufficient to liquefy argon) acting on the cluster source gas, e.g., argon, by way of a heat exchanger. Cooling of the gas must be controlled since the condensation thermodynamics of that gas in the nozzle will change rapidly as the gas is pre-cooled to nearer and nearer the bulk liquefaction temperature. Often an electronic temperature regulator is employed and this is more effective if an electrical heating element is provided in the heat exchanger region so as to provide a more rapid response and more tightly controlled temperature-regulation conditions. The temperature set point of the regulator is best put under electronic control and incorporated into the adaptive control electronics, thus allowing the cluster sizes to be adapted during the etching process.

Although the present invention has been shown and described with respect to several preferred embodiments thereof, various changes, omissions and additions to the form and detail thereof, may be made therein, without departing from the spirit and scope of the invention.

What is claimed is:

1. A method of processing a surface of a workpiece using an adaptive gas cluster ion beam wherein the processing of the surface comprises cleaning, smoothing, or etching the surface comprising:

providing a pressurized gaseous source material;

flowing the pressurized gaseous source material through a nozzle into a reduced-pressure chamber to form a jet of gas clusters:

ionizing the jet of gas clusters to form a gas cluster ion beam;

exposing the surface of the workpiece to the gas cluster ion beam wherein the gas cluster ion beam has an initial processing rate of cleaning, smoothing or etching;

monitoring a workpiece surface condition;

computing process parameters;

adapting the gas cluster ion beam during processing, based on said computing, so that the gas cluster ion beam then has at least one other processing rate, the at least one other processing rate being lower than the initial processing rate.

2. The method of claim 1, wherein the adapting step comprises adjusting ion acceleration potential of the gas cluster ion beam.

3. The method of claim 1, wherein the adapting step comprises adjusting ion beam current or beam current density of the gas cluster ion beam.

4. The method of claim 1, wherein the adapting step comprises adjusting fraction of multiply-ionized clusters of the gas cluster ion beam.

5. The method of claim 1, wherein the adapting step comprises adjusting the mean charge state of clusters of the gas cluster ion beam.

6. The method of claim 1, wherein the adjusting step comprises adjusting source gas pressure or temperature thereby altering the cluster-size distribution of the gas cluster ion beam.

7. The method of claim 1, wherein the adapting step comprises adjusting source gas composition of the gas cluster ion beam.

8. The method of claim 7, wherein the source gas composition is selected from the group consisting of argon, oxygen, nitrogen, sulfur hexafluoride, a halogen, a halogen containing compound, nitric oxide and carbon dioxide, any mixture thereof, and mixture with hydrogen or helium.

9. The method of claim 1, wherein the gas cluster ion beam is formed using an argon gas and the gas cluster ion beam has a broad cluster size distribution having most-probable sizes between 500 and 5000 atoms.

10. The method of claim 9, wherein the gas cluster ion beam is formed with an initial acceleration voltage greater than or equal to about 15,000 volts.

11. The method of claim 10, wherein the adapting step comprises reducing the initial acceleration voltage to at least one other acceleration voltage.

12. The method of claim 11, wherein the at least one other acceleration voltage is greater than or equal to about 5,000 volts.

13. The method of claim 11, wherein the initial acceleration voltage ranges from about 30,000 volts to about 50,000 volts and the at least one other acceleration voltage ranges from about 5,000 volts to about 7,000 volts.

14. The method of claim 1, wherein the gas cluster ion beam is formed using an argon gas, the gas cluster ion beam is accelerated by a fixed voltage ranging from about 7,000 volts to about 30,000 volts and the gas cluster ion beam has a broad cluster size distribution with most-probable sizes between 100 and 1,000 atoms.

15. The method of claim 14, wherein the adapting step comprises increasing the size distribution to a most-probable size of 5,000 to 50,000 atoms.

16. The method of claim 1, wherein the gas cluster ion beam is formed using an argon gas, the gas cluster ion beam has a cluster-size distribution with most-probable sizes between 500 to 5,000 atoms, and the gas cluster ion beam has an initial beam current density greater than or equal to 10 $\mu A/cm^2$.

17. The method of claim 16, wherein the adapting step comprises reducing the initial beam current density to at least one other beam current density wherein the at least one other beam current density is less than or equal to 1 $\mu A/cm^2$.

18. The method of claim 1, wherein the gas cluster ion beam is initially composed of clusters relatively cold compared with the freezing point of a source gas.

19. The method of claim 18, wherein the adapting step comprises warming the clusters to a higher temperature wherein the higher temperature is less than a condensation liquefaction temperature of the source gas.

20. The method of claim 1, wherein the gas cluster ion beam is formed using an argon gas mixed with an additional gas, wherein the additional gas is selected from the group consisting of oxygen, a halogen, and a halogen-containing compound thereby providing a more isomorphic etch rate on the surface of the workpiece wherein the workpiece is composed of two or more compositions.

21. The method of claim 20, wherein the adapting step comprises reducing the percentage of the additional gas in the gas mixture as the processing proceeds thereby rendering the surface of the workpiece nearly planar and smooth.

22. The method of claim 1, wherein the adapting step includes adjusting one or more parameters, wherein the parameters are selected from the group consisting of source gas composition, source gas temperature, gas cluster size, gas cluster charge state, beam acceleration potential, ion beam current, and ion beam current density.

23. The method of claim 1 further comprising monitoring the surface of the workpiece during processing in order to provide information about the surface, wherein the monitoring step is performed after the exposing step and before the adapting step.

24. The method of claim 23, wherein the information is surface roughness, surface smoothness, etch depth, or surface contamination.

25. The method of claim 23, wherein the adapting step is automatically performed based on the information provided during the monitoring step.

26. The method of claim 23, wherein the monitoring step and the adapting step are repeated at least once.

27. The method of claim 23, wherein the monitoring step is accomplished by an optical roughness monitor.

28. A method of processing a surface of a workpiece using an adaptive gas cluster ion beam comprising:

forming a gas cluster ion beam;

exposing the surface of the workpiece to the gas cluster ion beam wherein the gas cluster ion beam has an initial processing rate;

adapting the gas cluster ion beam during processing wherein the gas cluster ion beam has at least one other processing rate, the at least one other processing rate being lower than the initial processing rate;

wherein the gas cluster ion beam is formed with an initial acceleration voltage wherein the initial acceleration voltage ranges from about half a predetermined etching threshold value to about the predetermined etching threshold value and the exposing step is for a sufficient length of time to remove a substantial amount of contamination from the surface.

29. The method of claim 28, wherein the adapting step further comprises adjusting the initial acceleration voltage to at least one other acceleration voltage wherein the at least one other acceleration voltage is greater than the predetermined etching threshold value and greater than 15,000 volts, and then the at least one other acceleration voltage is reduced to a value greater than or equal to about 5,000 volts.

\* \* \* \* \*